(12) United States Patent
Arbel

(10) Patent No.: US 10,991,417 B1
(45) Date of Patent: Apr. 27, 2021

(54) AUTO-PRECHARGE MANAGEMENT IN A CONTROLLER

(71) Applicant: Xilinx, Inc., San Jose, CA (US)

(72) Inventor: Ygal Arbel, Morgan Hill, CA (US)

(73) Assignee: XILINX, INC., San Jose, CA (US)

( * ) Notice: Subject to any disclaimer, the term of this patent is extended or adjusted under 35 U.S.C. 154(b) by 19 days.

(21) Appl. No.: 16/422,923

(22) Filed: May 24, 2019

(51) Int. Cl.
  *G11C 11/408* (2006.01)
  *G06F 3/06* (2006.01)

(52) U.S. Cl.
  CPC ........ *G11C 11/4085* (2013.01); *G06F 3/0659* (2013.01)

(58) Field of Classification Search
  None
  See application file for complete search history.

(56) References Cited

U.S. PATENT DOCUMENTS

2011/0055495 A1* 3/2011 Wolford .............. G06F 13/1694
  711/154
2012/0089789 A1* 4/2012 Shirlen ............... G06F 12/0215
  711/154
2017/0255395 A1 9/2017 Weiner et al.

FOREIGN PATENT DOCUMENTS

WO    2009/025712 A1    2/2009

* cited by examiner

*Primary Examiner* — Charles J Choi
(74) *Attorney, Agent, or Firm* — Patterson + Sheridan, LLP

(57) ABSTRACT

A system includes a queue and a controller. The queue receives a transactions from masters to access a memory component. The memory component includes a plurality of rows. The controller issues a command to access a row of the plurality of rows in response to receiving a first issued transaction. The first issued transaction is issued by a first master. The controller is configured to prevent issuing an auto-precharge command to keep the row associated with the first issued transaction open if a subsequent transaction in the queue from the first master accesses a same row as the first transaction. The controller is configured to prevent issuing the auto-precharge command to keep the row associated with the first issued transaction open if the controller receives data associated with keeping the row associated with the first issued transaction open.

20 Claims, 15 Drawing Sheets

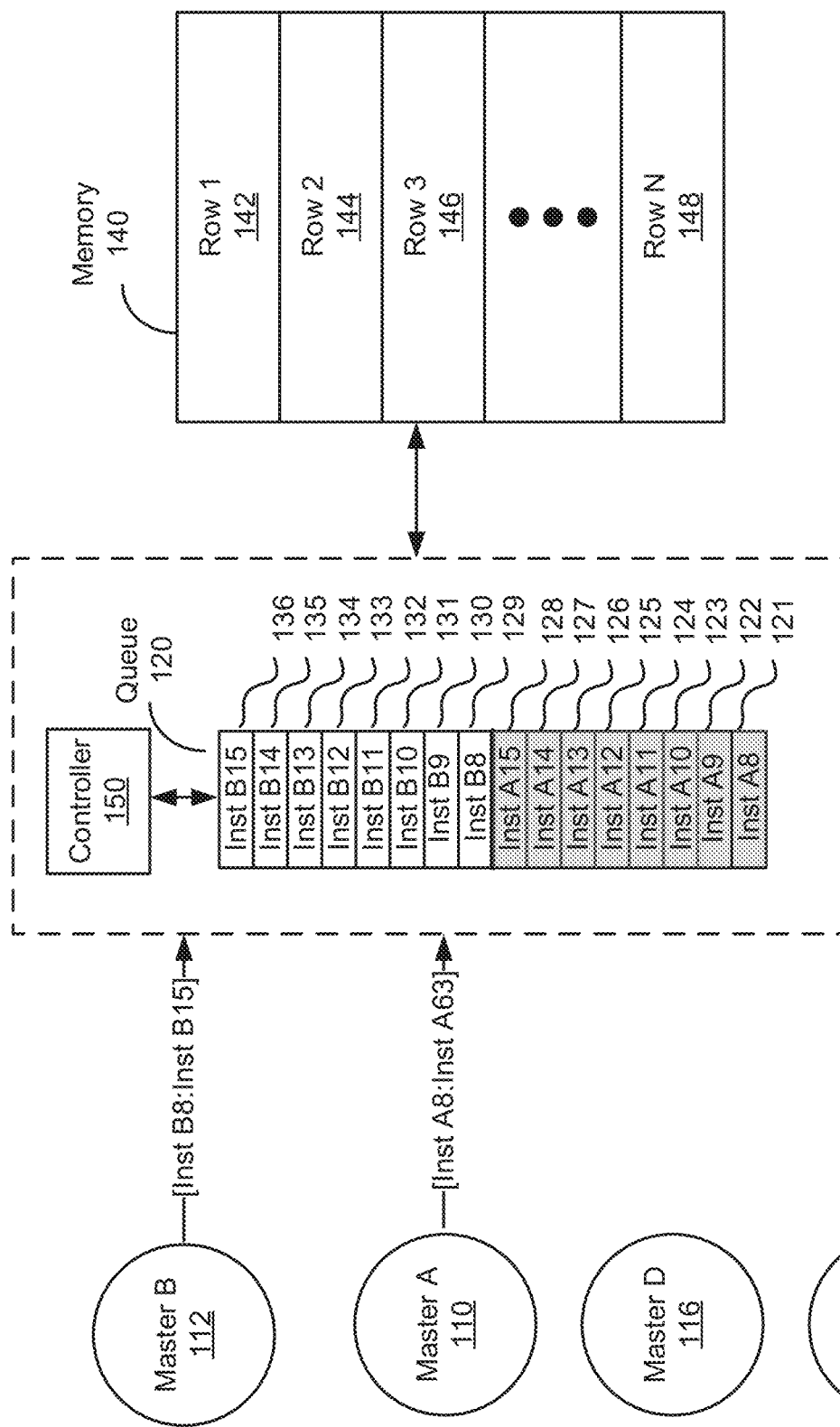

AUTO-PRECHARGE MANAGEMENT IN A CONTROLLER

TECHNICAL FIELD

The disclosure generally relates to managing auto-precharge for efficient memory accesses, and systems and circuits implementing the management of auto-precharge.

BACKGROUND

Memory management and access thereof has become increasingly important, to increase efficiency in processing, resources, etc. For example, efficiently accessing memory banks of a Dynamic Random Access Memory (DRAM) has become important. DRAM protocols may have commands, such as activate, to activate a given bank/row, read to read data, write to write data to a given bank/row, and precharge to close a given bank/row. Precharge command generally closes the row in preparation for accessing a different row. In some circumstances a given row may remain open until a precharge command is issued. Some protocols have defined a read with auto-precharge and write with auto-precharge to immediately close the row after the read or write. Auto-precharge may be beneficial when memory access is random in nature but it may result in performance degradation when memory access is linear, i.e. local. Prior techniques have used information such as history of memory bank accesses to determine whether auto-precharge should be issued. However, this technique is very process intensive and the past access may not be a good indication of future memory accesses. Some prior techniques have also leveraged the current content in the command queue. However, this technique falls short when the number of commands increase surpassing the queue size.

SUMMARY

Some memory components include banks and rows, where rows/banks are activated when the memory is being accessed. It is appreciated that each bank may include a plurality of rows. Memory components with rows/banks include Dynamic Random Access Memory (DRAM). When access to a row/bank is complete an auto-precharge command may be issued to close the bank/row. For example, if a queue contains no more transactions directed to a particular bank, then an auto-precharge command may be issued to close the bank. Similarly, if a queue contains no more transactions directed to a particular row within a bank, then an auto-precharge command may be issued to close the row. In some embodiments, the controller may prevent issuing an auto-precharge command as long as the queue includes other transactions to the same row, regardless of whether that row is being accessed by different masters. For example, the same row may be accessed and associated with different transactions within the queue from different masters. In such situation the row may be kept open by preventing the auto-precharge command to be issued. It is desirable to manage auto-precharge command to increase efficiency and improve memory access. It is appreciated that in some embodiments, an auto-precharge command may be issued if the queue contains no more transactions/commands directed to a particular row or bank, thereby closing that row or bank. It is further appreciated that in some embodiments auto-precharge command is not issued, to keep the row open, despite the transaction being processed is the last transaction in the queue from a given master, if the master sends an indication to keep the row open. It is appreciated that in some embodiments, the auto-precharge command is issued to close the row, in absence of receiving the indication to keep the row open, if the transaction being processed is the last transaction in the queue from a given master. In some embodiments, an auto-precharge command is issued if a next command in the queue from a given master is to access a different row than the transaction, from the same master, being processed now.

A system includes a plurality of masters, a queue, and a controller. The plurality of masters is configured to issue transactions to access a memory component. Each master of the plurality of masters is associated with a different thread. In some nonlimiting examples the transactions may be to read, or write to a row of a memory. As a result, the controller may issue an auto-precharge command, an activate command, a refresh command, etc. The memory component includes a plurality of rows. The queue is configured to receive the transactions from the plurality of masters. The controller is configured to issue a command to access a row of the plurality of rows in response to receiving a first issued transaction of the issued transactions. The first issued transaction is issued by a first master of the plurality of masters. The controller is further configured to issue an auto-precharge command to close the row associated with the first issued transaction if the queue includes no more transactions directed to that row within the bank. The controller is further configured to prevent issuing an auto-precharge command to keep the row associated with the first issued transaction open if a second issued transaction in the queue, subsequent to the first issued transaction, is from a master that is different from the first master and if the controller receives data associated with keeping the row associated with the first issued transaction open. In some nonlimiting examples, a size of the queue is smaller than a number of the transactions.

In some embodiments, the controller is further configured to issue the auto-precharge command to close the row associated with the first issued transaction if the second issued transaction is from a master that is different from the first master and if the controller receives no data associated with keeping the row associated with the first issued transaction open. In some nonlimiting examples, the controller may be further configured to issue the auto-precharge command to close the row associated with the first issued transaction if the second issued transaction is from the first master and if the second issued transaction is to access another row of the plurality of rows.

In some embodiments, the memory component may be a Double Data Rate (DDR), a High Bandwidth Memory (HBM), a Dynamic Random Access Memory (DRAM), or a Low Power (DDR) (LPDDR). In some nonlimiting examples, the controller may be a Double Data Rate (DDR) controller or a Dynamic Random Access Memory (DRAM) controller.

It is appreciated that in some nonlimiting examples, the data associated with keeping the row associated with the first transaction open may be encoded within a general bits of a bus transmitting the first transaction from the first master to the queue. In another nonlimiting example, the data associated with keeping the row associated with the first transaction open may be encoded within the first transaction. It is further appreciated that in some nonlimiting examples the data associated with keeping the row associated with the first transaction open may be transmitted via a separate transaction. According to some embodiments, each transaction of the issued transactions has an associated data indicating whether to keep the associated row open. In some nonlimiting examples, the data associated with keeping the row associated with the first issued transaction open is received from a user.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

FIGS. 1A-1K show a block diagram depicting a system for managing auto pre-charge commands for improving memory access, according to some examples.

To facilitate understanding, identical reference numerals have been used, where possible, to designate identical elements that are common to the figures. It is contemplated that elements of one example may be beneficially incorporated in other examples.

DETAILED DESCRIPTION

Figure 1A:
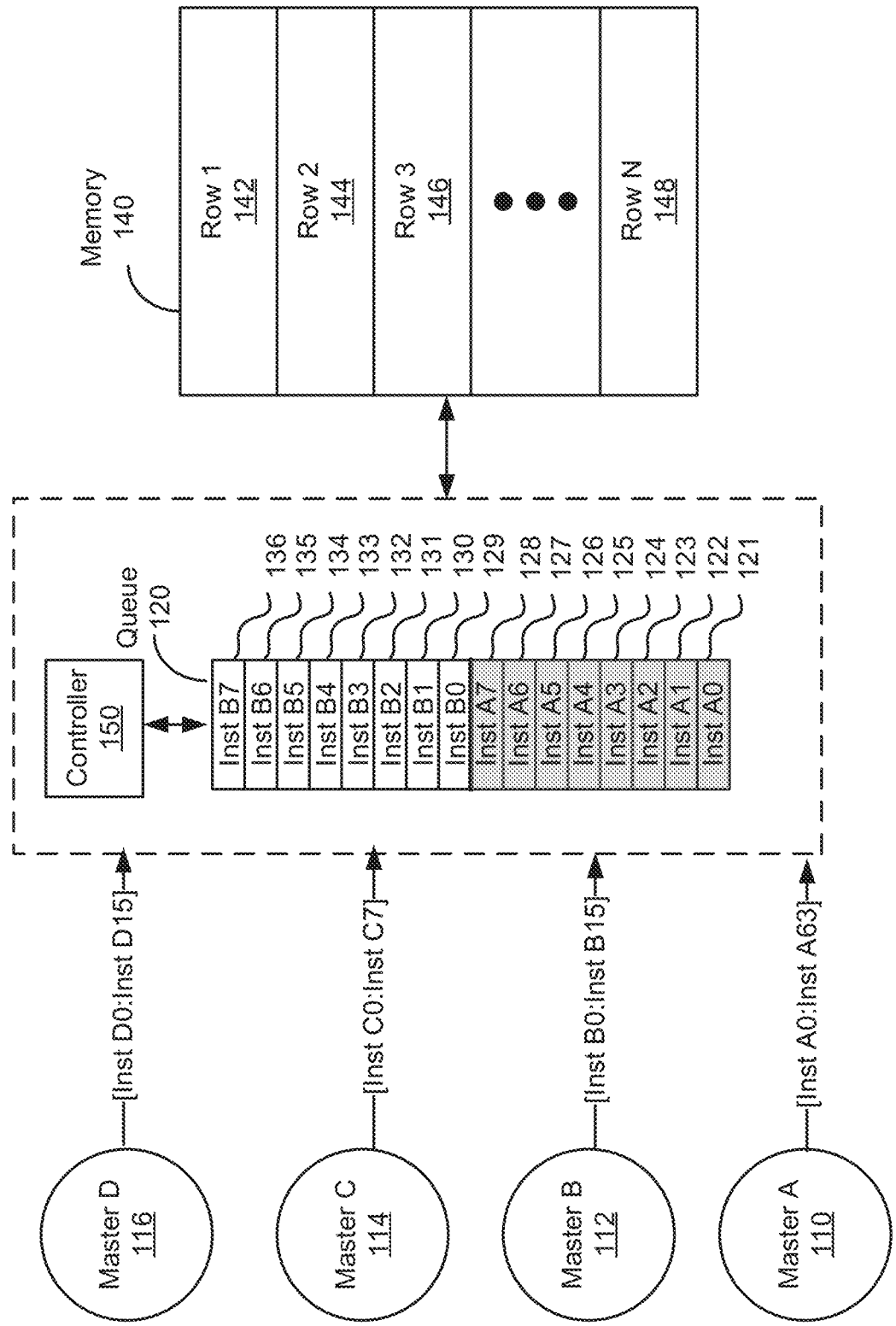
Figure 1B:
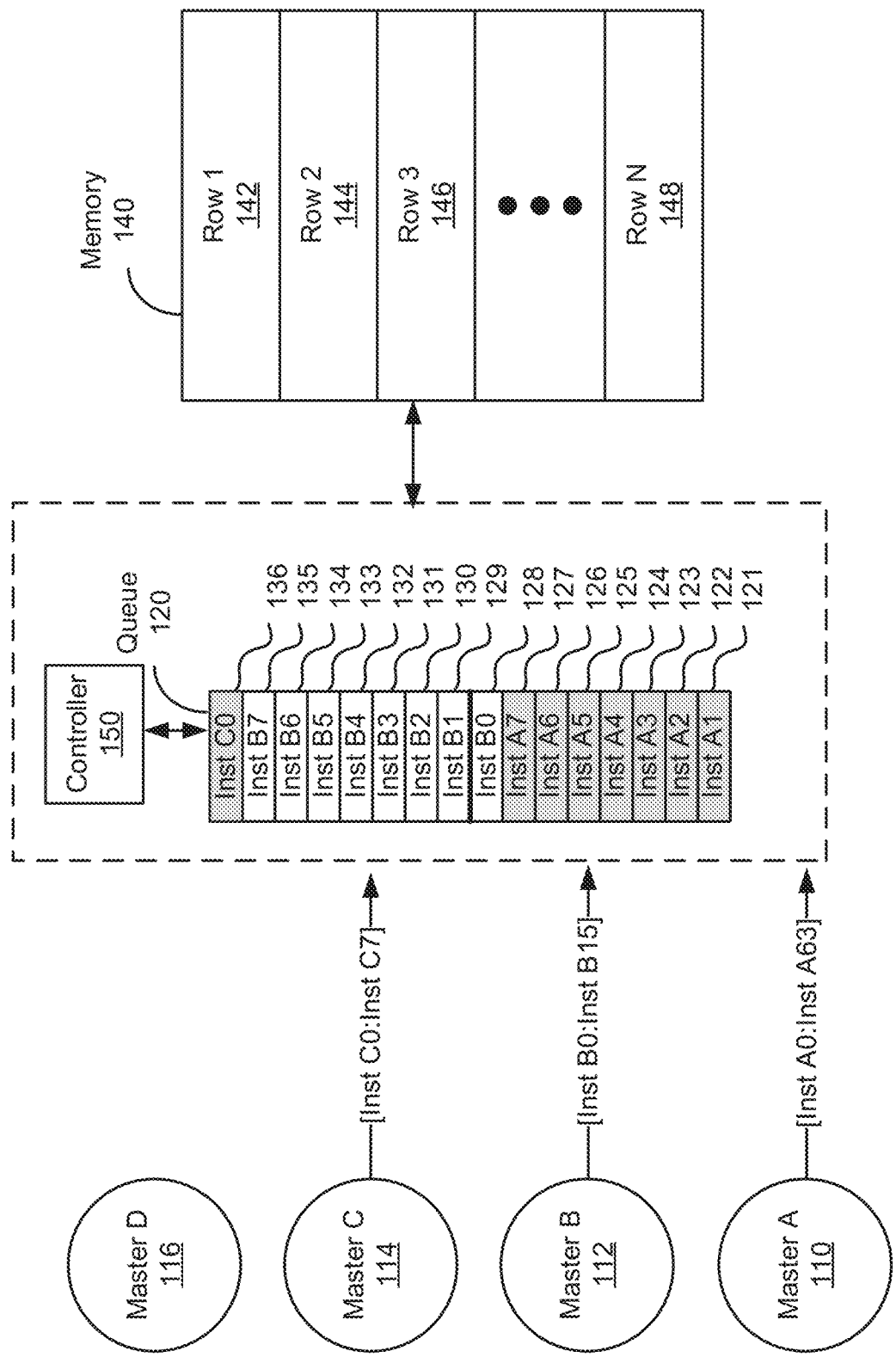
Figure 1C:
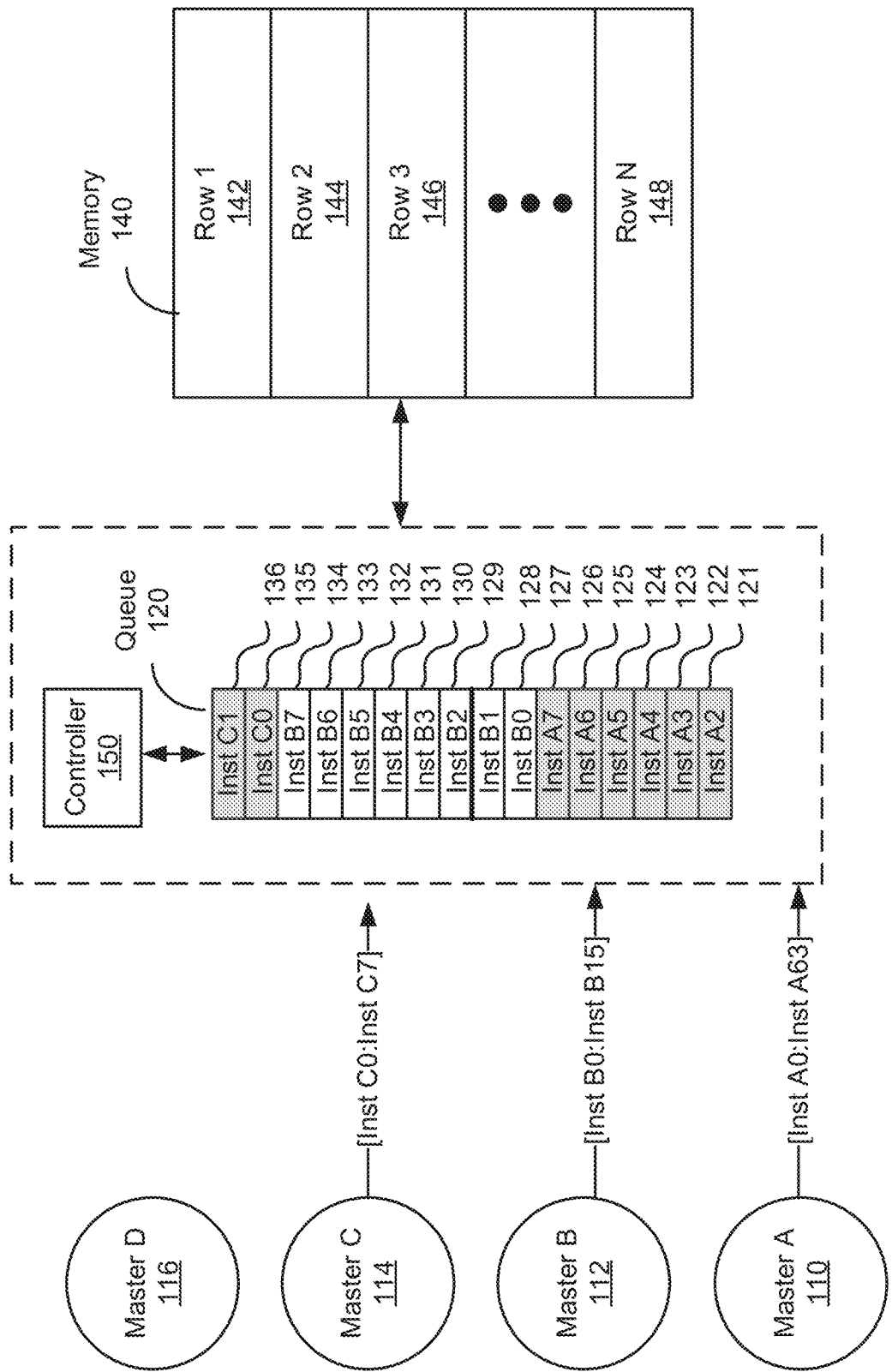

Examples described herein relate to efficient memory accesses and managing auto-precharge commands. It is appreciated that in some embodiments, an auto-precharge command may be issued by a controller, e.g., a Dynamic Random Access Memory (DRAM) controller, a Double Data Rate (DDR) controller, or the like, to access memory components with columns and/or rows such as Double Data Rate (DDR), High Bandwidth Memory (HBM), Dynamic Random Access Memory (DRAM), Low Power (DDR) (LPDDR), or the like.

The controller is configured to manage the auto-precharge commands to improve memory access. For example, a knowledge that a subsequent transaction, e.g., the very next subsequent transaction whether already in the queue or not, from the same master is going to access the same row currently being accessed (i.e. activated) can be used by the controller to keep the row open. As such, efficiency is improved by keeping the row open instead of closing the row and having to reopen it, e.g., by issuing an auto-precharge command, and having to reopen the same row, e.g., by issuing another activate command. Similarly, a knowledge that a subsequent transaction, e.g., the very next subsequent transaction whether already stored in the queue or not, from the same master is going to access a different row from the one being accessed (i.e. activated) can be used by the controller to close the row, e.g., by issuing an auto-precharge command, of the memory component rather than waiting and then closing it at a later time. As such, efficiency is improved by eliminating the delay in closing of the row.

In some nonlimiting examples, multiple masters, e.g., threads, transmit their respective transactions, e.g., activate, read, write, etc., to a queue. Each master may be a core, a Field Programmable Gate Array (FPGA), a processor, etc. The transactions are stored in the queue to be accessed and processed by the controller. However, inefficiencies may arise when the queue size is too small for the number of transactions. Moreover, inefficiencies may arise when the number of transactions is too many to be accommodated by the queue size. For example, if the queue size is too small then some transactions from one or more master may not be stored in the queue due to size limits. Thus, the controller may close the row of the memory being accessed (i.e. active) by issuing an auto-precharge command despite the last transaction of a given master in the queue and the next transaction for the same master (not yet in the queue) would access the same row. In other words, the controller closes the row being accessed because the controller is unaware of the fact that the next transaction not yet in the queue would access the same row. Accordingly, a need has arisen to notify the controller when to keep the row of the memory open by preventing issuance of an auto-precharge command, and when in absence thereof the controller would issue an auto-precharge command.

According to some embodiments, an auto-precharge command is issued to close a row of the memory being accessed when the queue contains no more transactions/commands directed to the row within a bank being access. For example, if a queue contains no more transactions directed to a particular row within a bank, then an auto-precharge command may be issued to close the row. Similarly, if a queue contains no more transactions directed to a particular bank, then an auto-precharge command may be issued to close the bank. It is also appreciated that in some embodiments an auto-precharge command is not issued to keep a row of the memory being accessed open when the queue contains other transactions/commands associated with the row that is currently open, regardless of whether that row is being accessed by different masters. For example, the same row may be accessed and associated with different transactions within the queue from different masters. In such situation the row may be kept open by preventing the auto-precharge command to be issued. It is further appreciated that in some embodiments the controller does not issue an auto-precharge command, to keep the row open, despite the transaction being processed is the last transaction in the queue from a given master, if the controller receives a notification from the master to keep the row open. It is appreciated that in some embodiments, the controller issues an auto-precharge command to close the row, in absence of receiving the indication from a given master to keep the row open, if the transaction being processed is the last transaction in the queue from that master. In some embodiments, the controller issues an auto-precharge command if a next command in the queue from a given master is to access a different row than the transaction, from the same master, being processed now. Accordingly, memory access is improved by intelligent management of auto-precharge commands.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. For example, various methods according to some examples can include more or fewer operations, and the sequence of operations in various methods according to examples may be different than described herein. In addition, an illustrated example need not have all the aspects or advantages shown. An aspect or an advantage described in conjunction with a particular example is not necessarily limited to that example and can be practiced in any other examples even if not so illustrated or if not so explicitly described.

Some general concepts will first be described to clarify terms and nomenclature used throughout this description.

Referring now to FIGS. 1A-1K, a block diagram depicting a system for managing auto pre-charge commands for improving memory access, according to some examples is shown. Master A 110, master B 112, master C 114, and master D 116 issue transactions that are sent to the queue 120. The transactions being issued may be threads in a multicore system. The controller 150 processes the transactions in the queue 120, e.g., a first in first out (FIFO), and accesses a memory component 140. The controller 150 may be a DRAM controller, a DDR controller, or the like, to access memory components with columns and/or rows such as DDR, HBM, DRAM, LPDDR, or the like. The memory component 140 may be a memory with rows and/or columns. For example, memory 140 may include rows 142, 144, 146, . . . , 148.

Master A 110 may issue transactions <Inst A0:Inst A63>, as an example. Master B 112 may issue transactions <Inst B0:Inst B15>, as an example. Master C 114 may issue transactions <Inst C0:Inst C7>, as an example and master D 116 may issue transactions <Inst D0:Inst D15>, as an example. Transactions may include read, write, etc. It is appreciated that the transactions from the masters may be of any size and even be arbitrary in size, e.g., a single command of a 64-bit for a DDR4 bus to access 64 bytes. The controller may issue an activate command, a precharge command, a refresh command, etc. for the transactions from the masters. Furthermore, the controller 150 may divide the received transactions into smaller size and it may align them.

According to a nonlimiting example, the queue 120 size is smaller than the number of transactions from the masters 110-116 being issued. In other words, the queue 120 size cannot accommodate all masters and all instructions simultaneously because the queue 120 size can accommodate only 16 instructions at the same time. The queue 120 has entries 121-136.

It is appreciated that the embodiments are described with respect to processing transactions from more than one master at a time. For example, the embodiments are described with respect to sending transactions from more than one master to the queue. However, it is appreciated that in other nonlimiting examples one master at a time may be processed and therefore the description of the embodiments with respect to processing transactions from more than one master at a time is for illustrative purposes and should not be construed as limiting the scope of the embodiments.

In this nonlimiting example, master A 110 sends Inst A0 to the queue 120 that is stored in location 121. Subsequently master A 110 sends Inst A1 to the queue 120 that is stored in location 122. Similarly, other transactions from master A 110 are transmitted to the queue 120. For example, Inst A2 through Inst A7 are transmitted and stored in locations 123-128 of the queue 120, respectively, and are queued up for processing. In this nonlimiting example, 8 transactions at a time from each master are being processed, therefore the next 8 transactions are transmitted from master B 112. It is appreciated that processing 8 transactions at a time from each master is for illustrative purposes and not intended to limit the scope of the embodiments. For example, 4 transactions from each master may be submitted, i.e. 4 transactions from master A 110, 4 transactions from master B 112, 4 transaction from master C 114, and 4 transaction from master D 116.

In this nonlimiting example, 8 transactions are transmitted from master B 112 to the queue 120. For example, Inst B0 through Inst B7 are transmitted and stored in locations 129 through 136 of the queue 120.

It is appreciated that in some nonlimiting examples, the controller 150 may rearrange the transactions in the queue 120 in order to improve memory access. For example, the controller 150 may rearrange transactions that access the same row subsequent to one another in the queue 120 such that the need to close the row and to open a different row is eliminated, thereby improving memory access. Moreover, the controller 150 has visibility into the queue 120 and transactions stored thereon. It is appreciated that throughout the remainder of the application references are made to closing a row or keeping a row open and that any references thereto is directed to a row within a given bank. In other words, there may be multiple rows being accessed on different banks at the same time.

The controller 150 accesses Inst A0 from entry 121 of the queue 120. The controller 150 processes the transaction and determines which row in the memory 140 should be accessed. As such, an activate command may be transmitted to the appropriate row, e.g., row 146, to activate the row, in order for the row to become accessible. As described above, the controller 150 has visibility into the transactions within the queue 120. As such, the controller 150 has apriori knowledge, at the time that Inst A0 is being processed, whether the row associated with Inst A0 should be closed or kept open after processing Inst A0 is complete.

It is appreciated that the apriori knowledge may be partially based on the subsequent transaction in the queue 120 being processed. For example, the controller 150 may determine whether the row being accessed, e.g., row 146, that is associated with the transaction being processed, e.g., Inst A0, should be closed after the processing is complete based on whether the row associated with the transaction subsequent to the transaction being processed, hence Inst A1, is associated with the same row, e.g., row 146. In other words, if Inst A1 is associated with the same row as Inst A0, the controller 150 does not issue an auto-precharge command to keep the row open, thereby improving memory access. In contrast, the controller 150 issues an auto-precharge command to close the row being access now, e.g., row 146, if Inst A1 is associated with a different row than Inst A0, e.g., row 144.

It is appreciated that after Inst A0 is processed, other transactions in the queue 120 are advanced. In other words, referring now to FIG. 1B, Inst A1 advances from entry 122 to entry 121 in the queue 120. Similarly, other transactions in the queue 120 advance, therefore making entry 136 available for the next transaction from one of the masters. As discussed above, in this illustrative example, it is assumed that 8 transactions from each master are being processed in a round-robin fashion to accommodate all masters. However, in other examples a different servicing scheme may be employed. In this nonlimiting example, the next 8 transactions are from Master C 114. As such, Inst C0 from master C 114 is transmitted to the available entry 136 of the queue 120.

It is appreciated that similar to FIG. 1A, the controller 150 has visibility to entries within the queue 120 and can rearrange the transactions, if desired. In this nonlimiting example, similar to FIG. 1A, the controller 150 processes the next transaction in the queue, e.g., Inst A1, from entry 121 of the queue 120. While Inst A1 is being processed, the controller 150 determines whether the row associated with Inst A1 being processed should be closed after the processing is complete, similar to that described in FIG. 1A. As discussed above, the determination whether to close the row associated with Inst A1 may be partially based on the next transaction in the queue, e.g., Inst A2 in entry 122 of the queue 120, and whether the next transaction accesses the same row or a different row than the transaction being processed. In other words, the controller 150 determines whether to issue an auto-precharge command to close the row being accessed or to avoid issuing the auto-precharge command to keep it open for the next transaction in the queue, e.g., Inst A2 from entry 122.

It is appreciated that after Inst A1 is processed, other transactions in the queue 120 are advanced. In other words, referring now to FIG. 1C, Inst A2 advances from entry 122 to entry 121 in the queue 120. Similarly, other transactions in the queue 120 advance, therefore making entry 136 available for the next transaction from one of the masters. As such, Inst C1 from master C 114 is transmitted to the available entry 136 of the queue 120. It is appreciated that the process, as described in FIGS. 1A-1C, continues and each transaction in the queue gets processed accordingly.

Figure 1D:
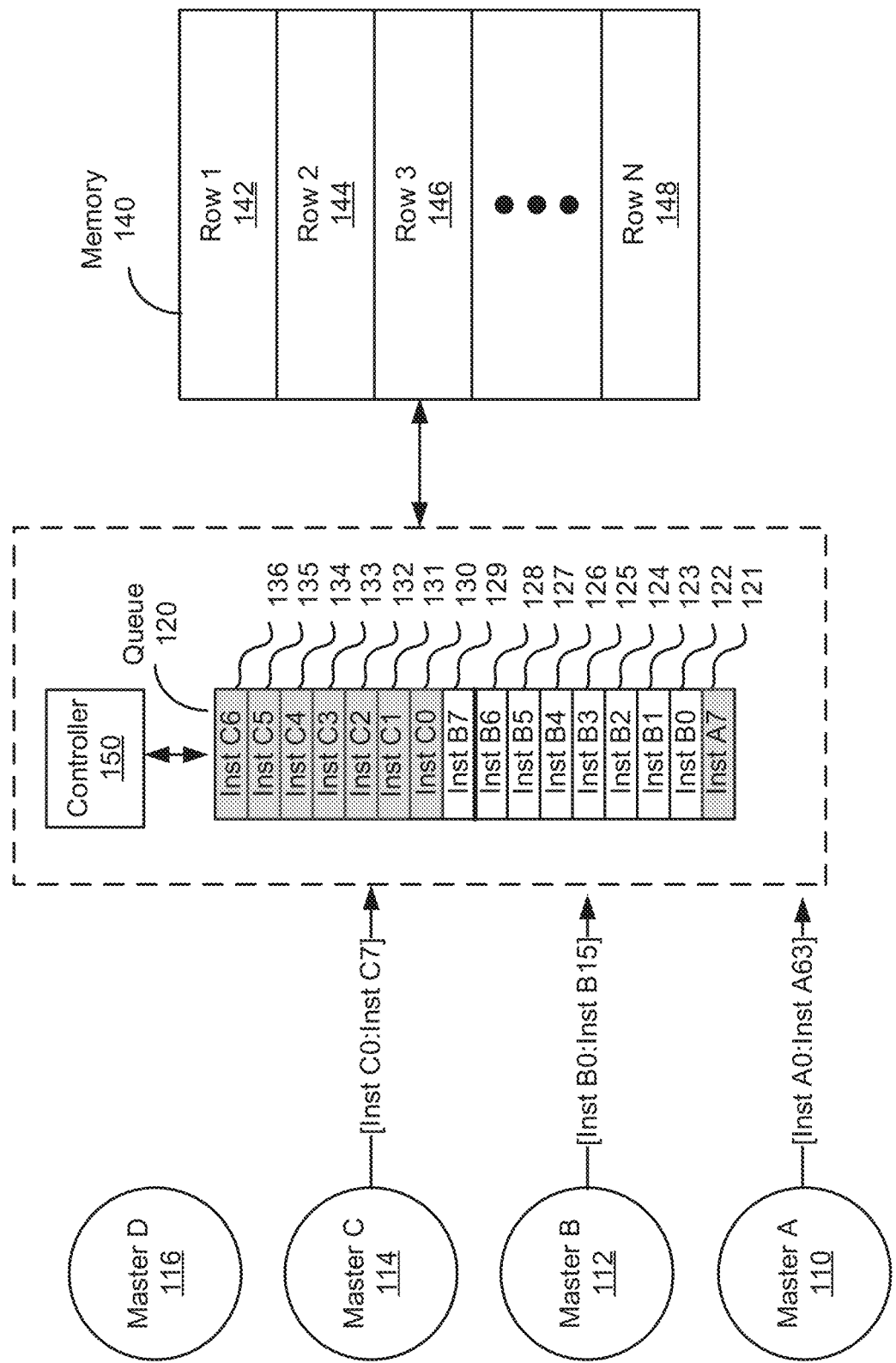

Referring now to FIG. 1D, the last transaction, e.g., Inst A7, from master A 110 in the queue 120 is being processed. In this nonlimiting example, since the size of the queue 120 is small in comparison to the number of transactions from the masters 110-116, the queue 120 would not include other transactions from the masters, e.g., Inst A8:Inst A63 and Inst B8:Inst B15 and Inst D0:D15. In the conventional system the controller 150 looks at the content of the queue 120 and issues an auto-precharge command to close the row associated with the last transaction, e.g., Inst A7, from master A 110 since there are no other transactions from master A 110 in the queue 120. However, knowledge of other transactions not yet in the queue 120 can be used to more appropriately manage auto-precharge commands and therefore improve memory access.

In this nonlimiting example, Inst A8 that is not yet in the queue 120 but is subsequent to Inst A7 being processed, may or may not access the same row as Inst A7. Auto-precharge command should be issued if Inst A8 accesses a different row than Inst A7 in order to close the row being accessed after Inst A7 is processed. However, if Inst A8 accesses the same row as Inst A7 then no auto-precharge command should be issued to keep the row being accessed open.

In some embodiments, the controller 150 may receive additional data whether to issue an auto-precharge command or not. For example, master A 110 issuing transactions Inst A0:Inst A63 may have knowledge of the row associated with each transactions. As such, when Inst A7 is transmitted to the queue 120 it may have been accompanied with data whether to keep the row associated with Inst A7 open or to close it by issuing an auto-precharge command. In other words, Inst A7 may be accompanied with additional data to keep the row being accessed open if the subsequent transaction, e.g., Inst A8, issued by the same master, e.g., master A 110, accesses the same row as the previous transaction, e.g., Inst A7. In contrast, Inst A7 may be accompanied with additional data to close the row being accessed if the subsequent transaction, e.g., Inst A8, issued by the same master, e.g., master A 110, accesses a different row than the previous transaction, e.g., Inst A7. The additional data used by the controller 150 whether to issue an auto-precharge command or not may be entered by a user, e.g., user designing or programming master A 110.

It is appreciated that while the illustrative examples describe the additional data accompanied the transactions, other methods of communicating the additional data are also possible, e.g., a separate instruction may be sent, etc. Other methods of communicating the additional data are discussed with respect to FIGS. 2A-2B and 3.

It is appreciated that the additional data may generally be referred to as hint bits. In some embodiments, each transaction may be accompanied with some bits indicating whether to issue an auto-precharge command, not to issue an auto-precharge command, to allow the controller to determine whether to issue an auto-precharge command, to prevent an auto-precharge command from being issued if the controller determines that an auto-precharge command should be issued but if hint bits are received to prevent auto-precharge command from being issued, or any combination thereof.

In other words, hint bits can be used by the controller 150 to manage issuing auto-precharge commands more effectively to improve memory access. It is appreciated that the use of hint bits enables the controller 150 to make a decision whether to issue an auto-precharge command not only based on the content of the queue 120 but also based on the transactions issues by masters that are not yet in the queue 120. As such, memory access can be improved by more effectively managing auto-precharge commands.

Figure 1E:
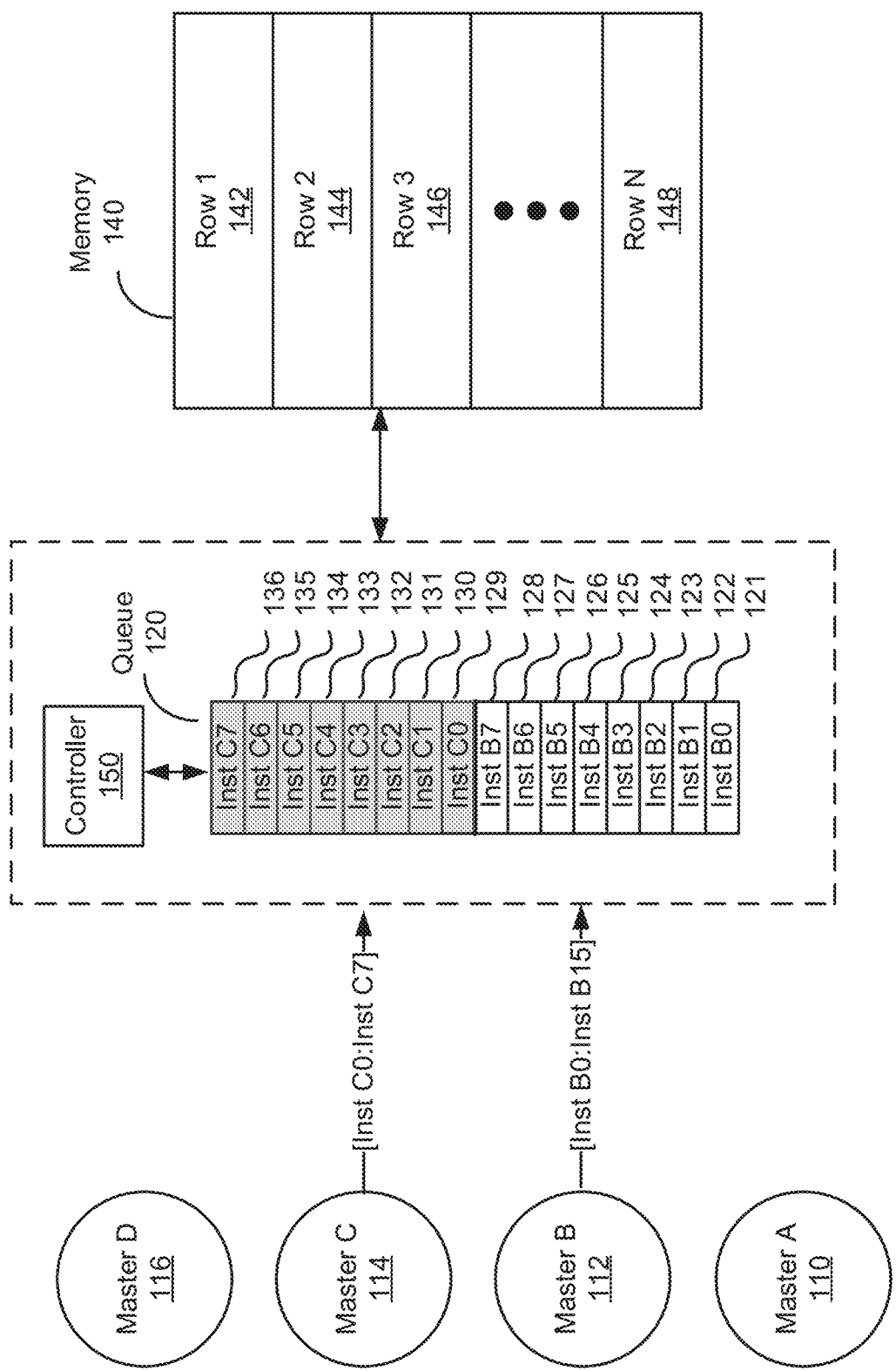

After Inst A7 is processed, the transactions in the queue 120 are advanced, as shown in FIG. 1E, and as described in FIGS. 1A-1D, in order to accommodate other transactions. In other words, Inst B0 advances from entry 122 to entry 121 in the queue 120. Similarly, other transactions in the queue 120 advance, therefore making entry 136 available for the next transaction from one of the masters. As such, Inst C7 from master C 114 is transmitted to the available entry 136 of the queue 120. It is appreciated that the process, as described in FIGS. 1A-1D, continues and each transaction in the queue gets processed accordingly.

Figure 1F:
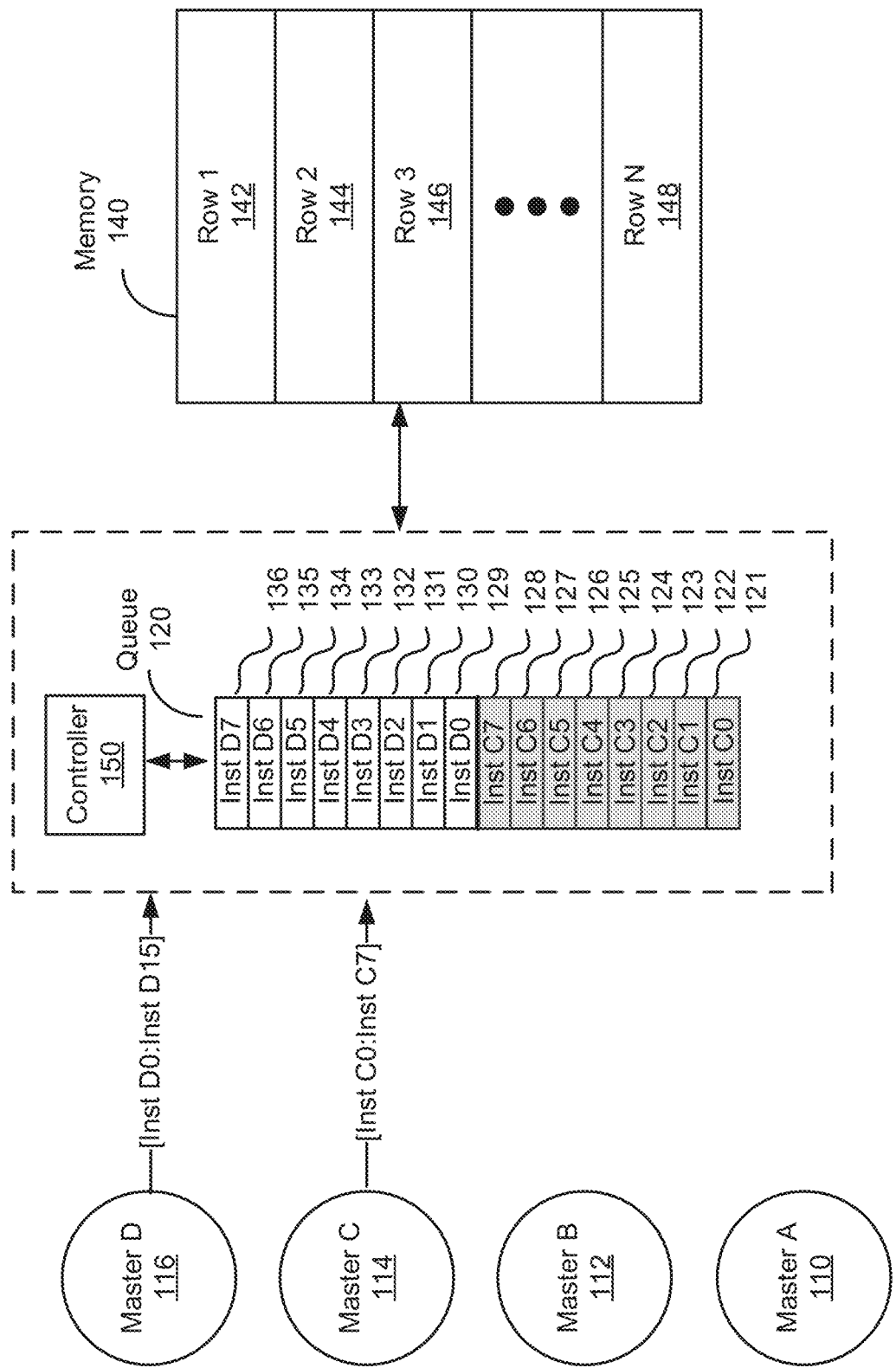

It is appreciated that the process, as described in FIGS. 1A-1E continues until transactions, e.g., Inst B0:Inst B7, from master B 112 is processed and transactions, e.g., Inst D0:D7, from master D 116 are similarly stored in the queue 120, as shown in FIG. 1F. The first 8 transactions from master D 116 and the first 8 transactions from master C 114 are now stored in the queue 120 and are processed, as described above. It is appreciated that the next transaction to be transmitted to the queue 120 when the controller 150 processes transaction Inst C0, is Inst A8 from master A 110.

Figure 1G:
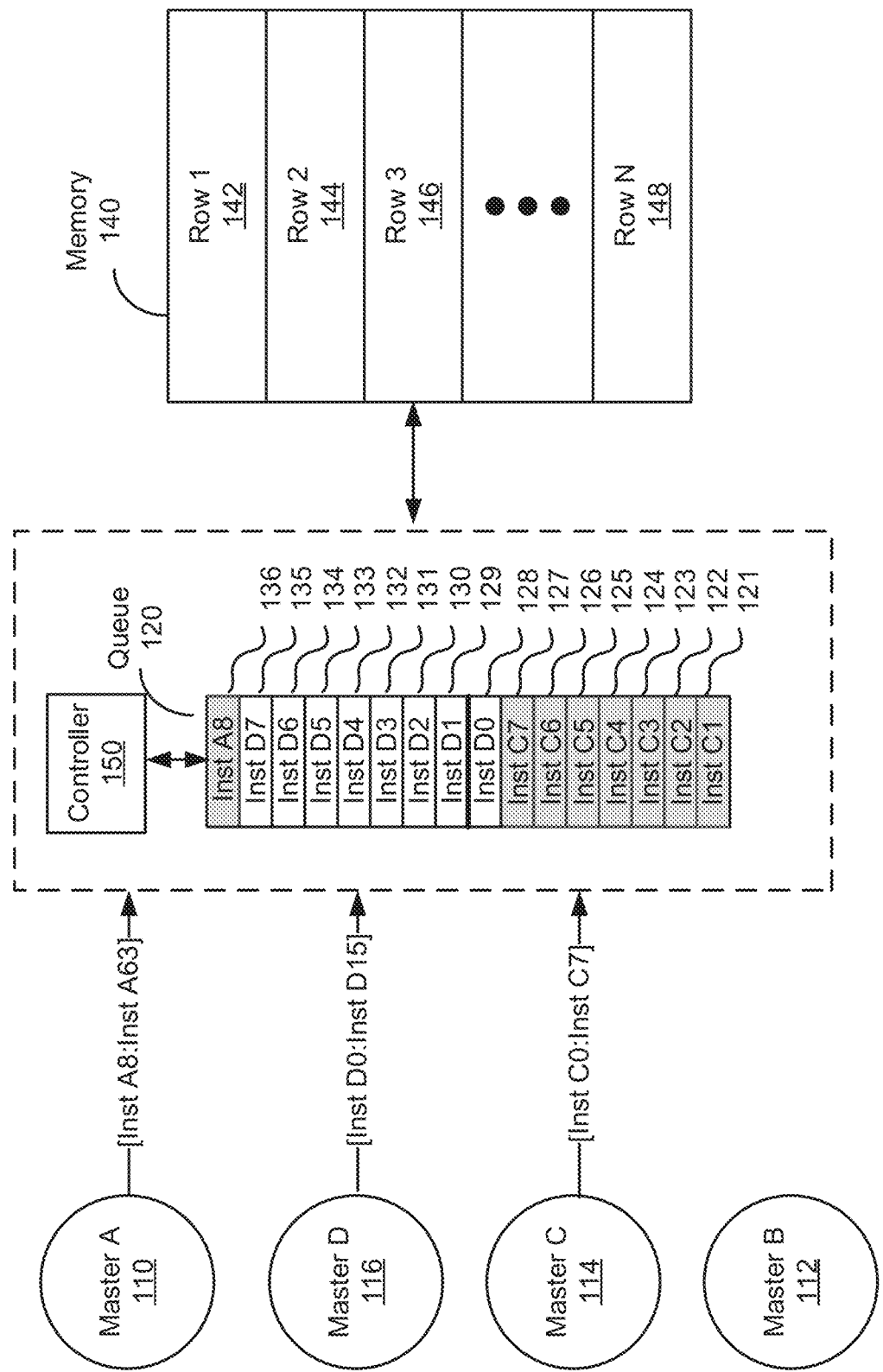

Referring now to FIG. 1G, Inst C0 has been processed and transactions within the queue 120 advance, therefore making entry 136 available for the next transaction, e.g., Inst A8, from master A 110. It is appreciated that the controller 150 has apriori knowledge of whether Inst A8 uses the same row as Inst A7 that was previously processed. In other words, if Inst A8 is associated with the same row as Inst A7, then the row associated therewith is kept open by preventing the controller 150 from issuing an auto-precharge command, therefore improving memory access. In contrast, if Inst A8 is associated with a different row as Inst A7, then the row associated with Inst A7 was closed by issuing an auto-precharge command instead of having to wait to receive the Inst A8 to make this determination. Therefore, memory access is improved.

Figure 1H:
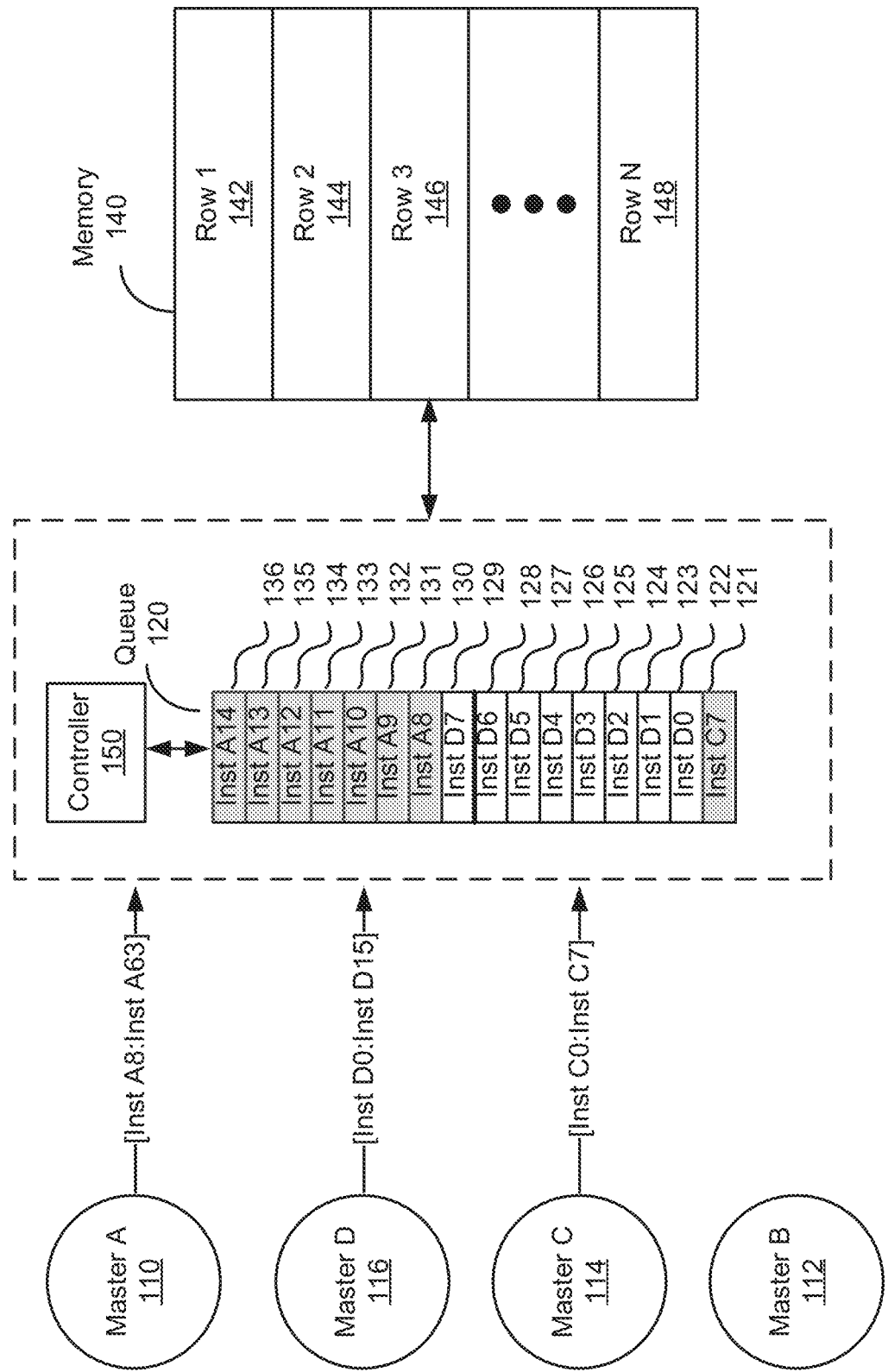

The process as described above with respect to FIGS. 1A-1G continues, until the last transaction, e.g., Inst C7, from master C 114 in the queue is being processed, as shown in FIG. 1H. When Inst C7 is being processed, the controller 150 has apriori knowledge with respect to subsequent transactions from master C 114 that are not yet in the queue 120. In this nonlimiting example, the controller 150 has apriori knowledge that Inst C7 is the last transaction from master C 114. Accordingly, the controller 150 issues an auto-precharge command to close the row associated with Inst C7. It is appreciated that in some embodiments, the controller 150 may have received data indicating that Inst C7 is the last transaction or it may have received hint bits to close the row associated with Inst C7. As such, the row associated with Inst C7 is closed and becomes available for other masters and transactions.

Figure 1I:
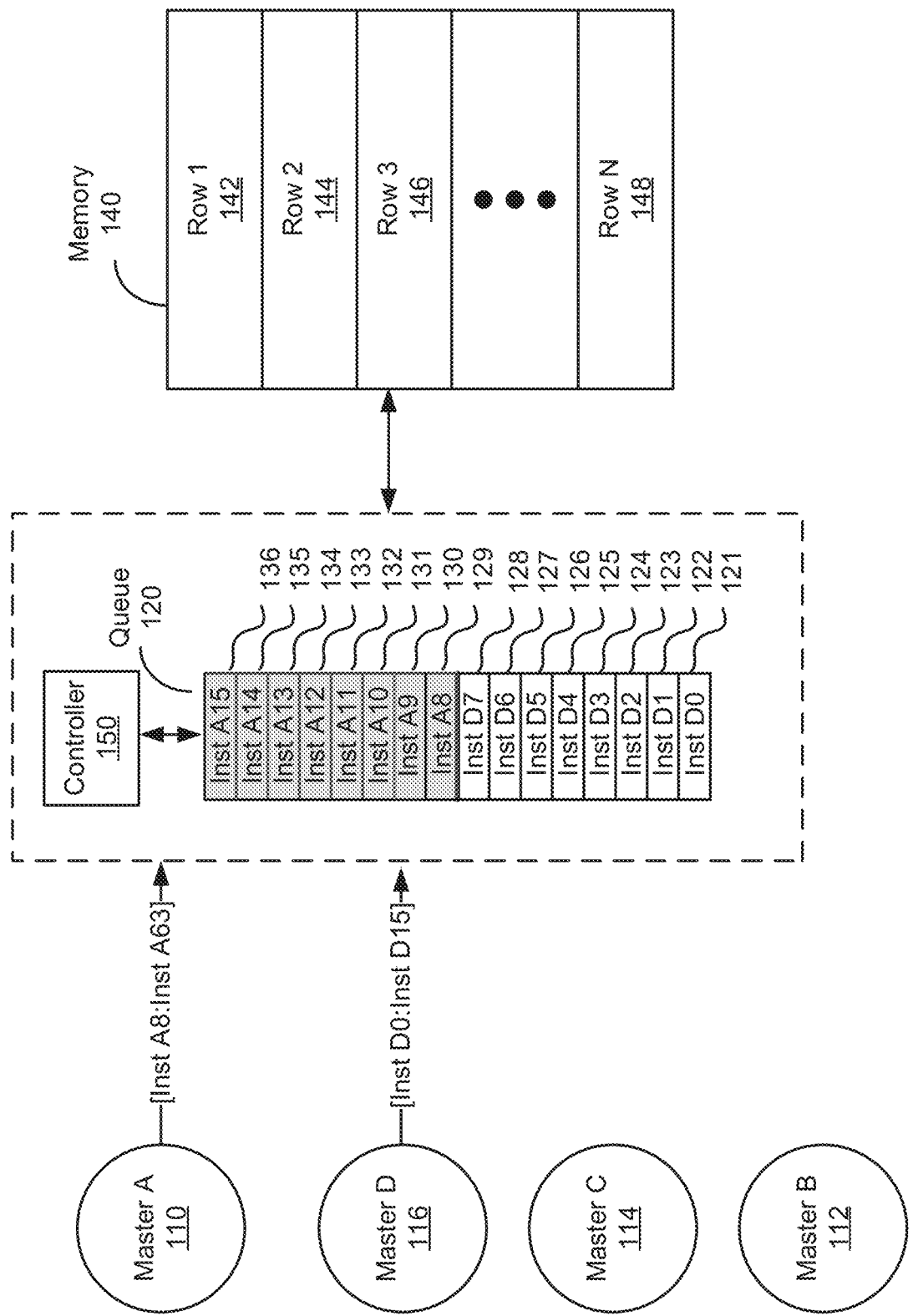
Figure 1K:
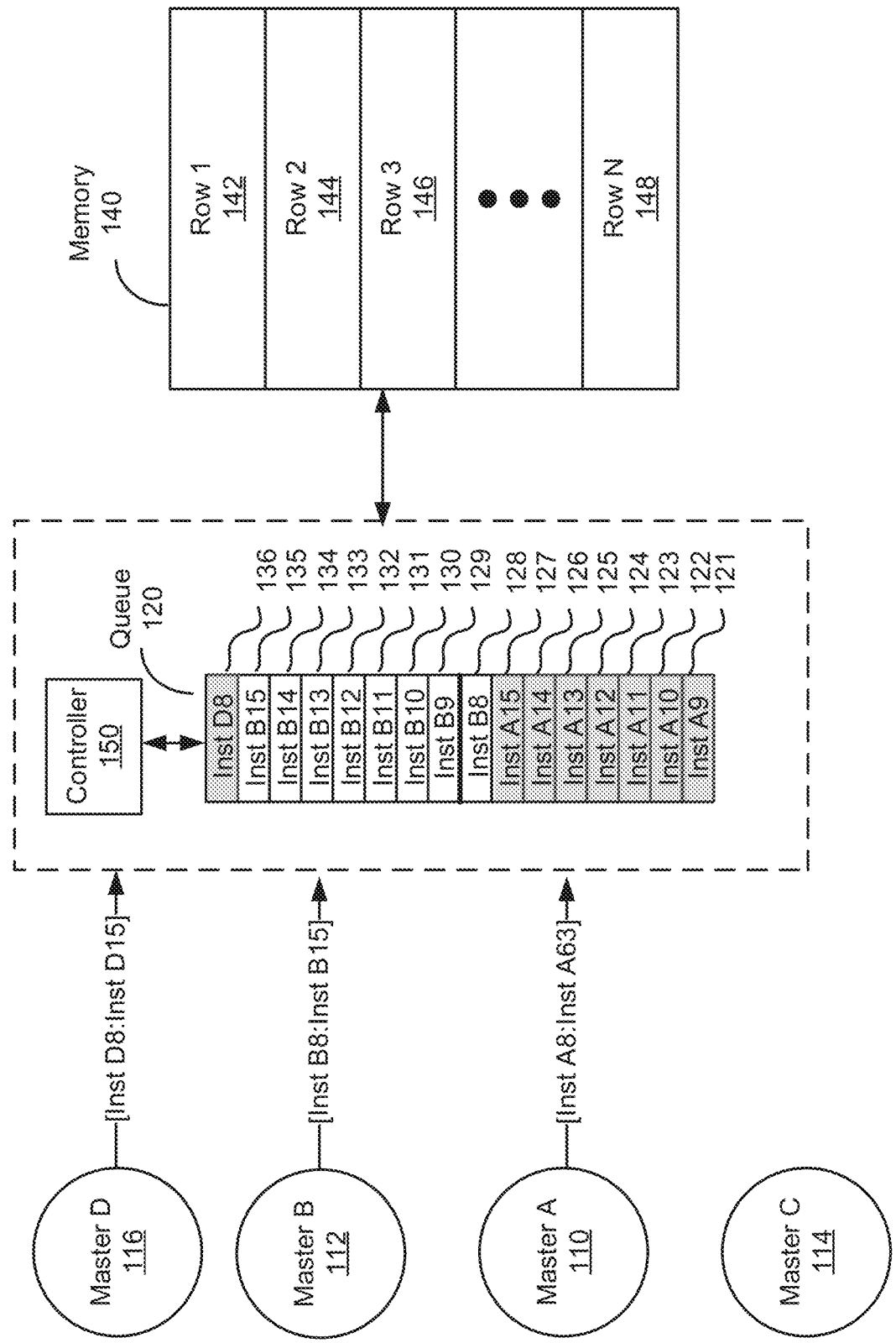

It is appreciated that the process, as described above with respect to FIGS. 1A-1H, continues until the queue is filled up with Inst D0:Inst D7 from master D 116 and further Inst A8:A63 from master A 110, as shown in FIG. 1I. It is appreciated that the process, as described above continues until Inst D0:Inst D7 from master D 116 is processed and next set of transactions, e.g., Inst B8:615, are stored in the queue 120, as shown in FIG. 1J. It is appreciated that once Inst A8 from entry 121 in the queue 120 is processed, the transactions within the queue 120 are advanced making entry 136 available for the next transaction, e.g., Inst D8, from master D 116, as shown in FIG. 1K. It is further appreciated that the process, as described above continues, until all transactions are processed.

It is appreciated that the number of masters, the number of transactions from each master, the size of the queue, and the number of transactions and masters being accommodated at the time, the round-robin fashion of the transactions, etc., is for illustrative purposes and should not be construed as limiting the scope of the embodiments.

Figure 2A:
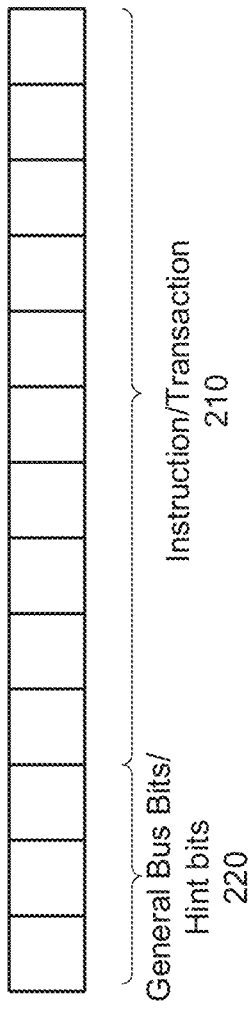
FIGS. 2A-2B show exemplary encoding of hint bits for managing auto-precharge commands for improving memory access, according to some examples.
Figure 2B:
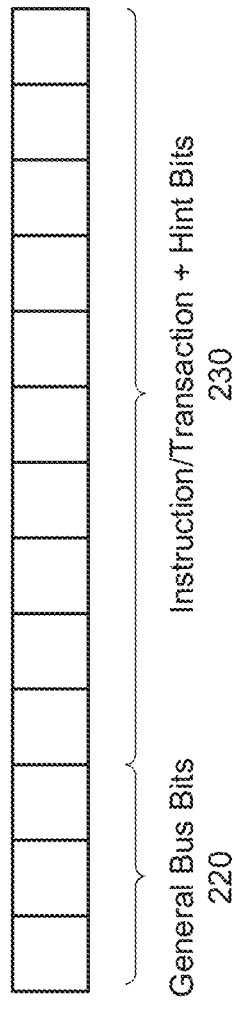

Referring now to FIGS. 2A-2B, exemplary encoding of hint bits for managing auto-precharge commands for improving memory access, according to some examples is shown. In a nonlimiting example, each transaction may be accompanied with hint bits regarding whether an auto-precharge command to be issued by the controller, as described above. Referring specifically to FIG. 2A, the bus, e.g., Amba AXI bus, accommodating transmission of the transactions/instructions may have some general bits that can be used to transmit the hint bits, as described above. In some embodiments, each transaction/instruction 210 may be accompanied with hint bits that are encoded within the general bus bits 220. In other words, each instruction/transaction 210 may have an accompanying hint bits to notify the controller whether to issue an auto-precharge command, not to issue an auto-precharge command, to allow the controller to determine whether to issue an auto-precharge command, to prevent an auto-precharge command from being issued if the controller determines that an auto-precharge command should be issued but if hint bits are received to prevent auto-precharge command from being issued, or any combination thereof.

Referring now to FIG. 2B, the hint bits are encoded within the transaction/instruction 230 instead of being accompanied via the general bus bits 220.

Figure 3:
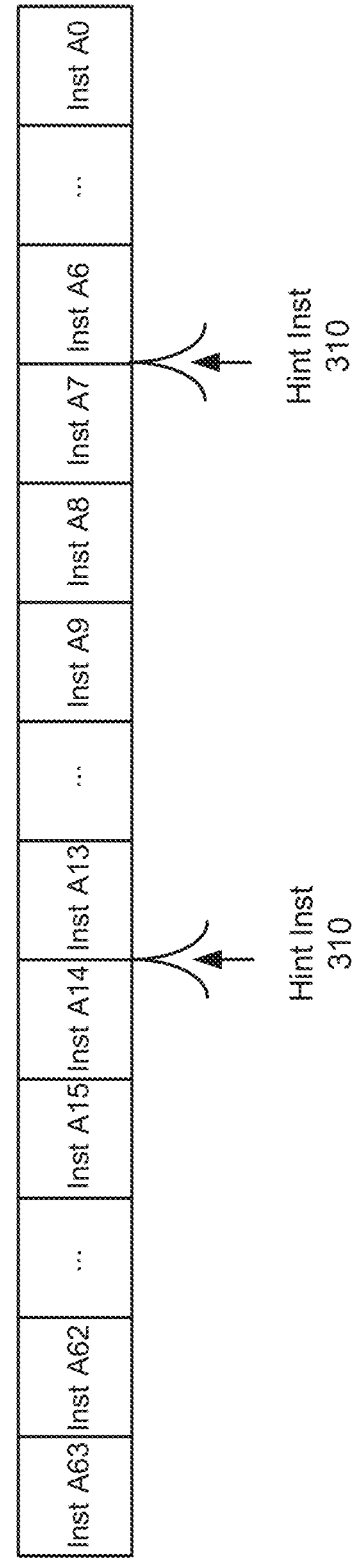
FIG. 3 shows an exemplary hint bits instructions for managing auto-precharge commands for improving memory access, according to some examples.

Referring now to FIG. 3, an exemplary hint bits instructions for managing auto-precharge commands for improving memory access, according to some examples is shown. In this nonlimiting example, instead of accompanying each transaction/instruction with hint bits, as described above, a hint instruction 310 may be inserted within other transactions/instructions where appropriate. In this nonlimiting example and with reference to FIGS. 1A-1K, since the controller 150 had only access to instructions within the queue 120 and 8 transaction from each master is processed in a round-robin fashion, the controller 150 has to determine whether to issue an auto-precharge command after Inst A7, after Inst A13, etc. As such, a hint instruction, e.g., Hint Inst 310, may be inserted after Inst A6 and before Inst A7 such that when Inst A7 is being processed, the controller 150 would have aprior knowledge of whether to issue an auto-precharge command after Inst A7 is processed, after Inst A14 is processed, etc. It is appreciated that the hint instruction may be entered between any two transactions/instructions as long as the controller 150 would be able to have aprior knowledge whether to issue an auto-precharge command when the last transaction/instruction in the queue from a given master is being processed. It is appreciated that a hint instruction may similarly be inserted for other masters and threads.

Figure 4:
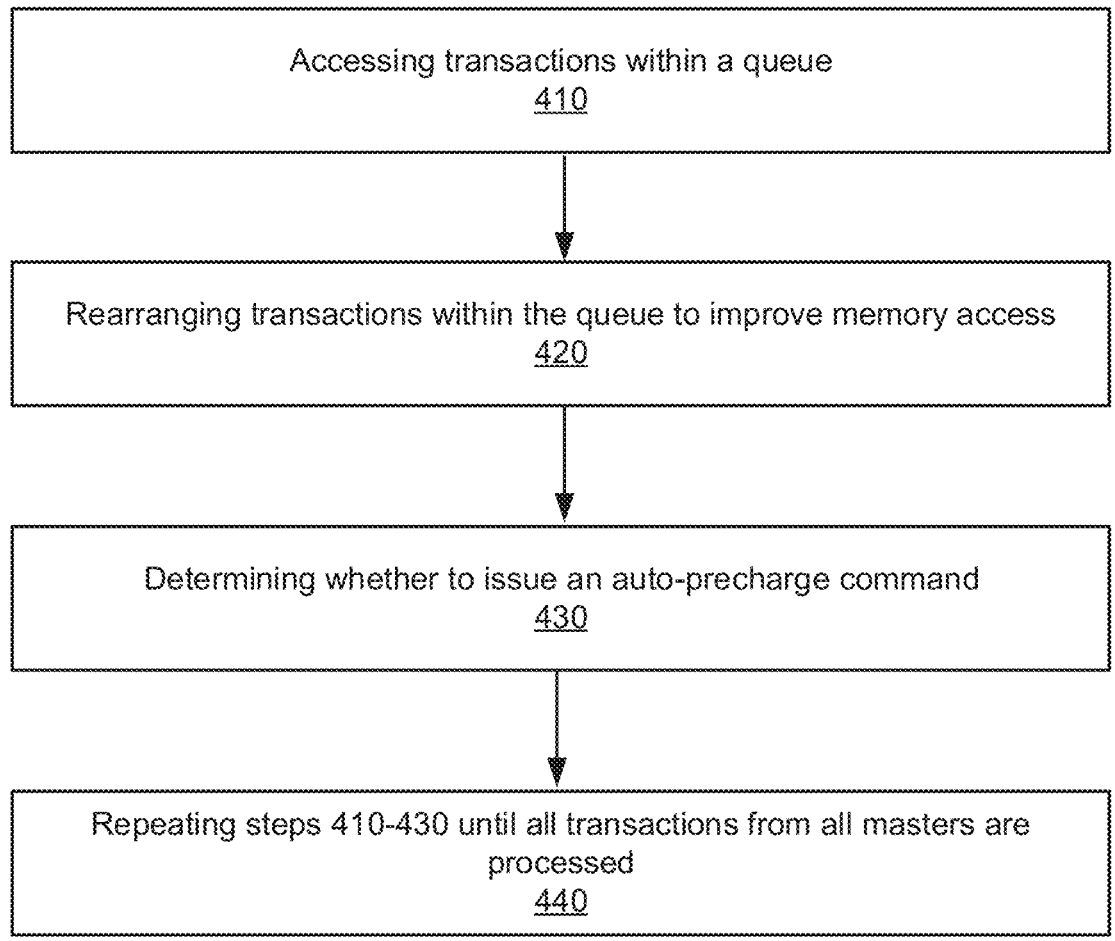
FIG. 4 shows a method flow for managing auto-precharge commands for improving memory access, according to some examples.

Referring now to FIG. 4, a method flow for managing auto-precharge commands for improving memory access, according to some examples is shown. At step 410, transactions within the queue are accessed by the controller, as described in FIGS. 1A-1K. At step 420, the transactions within the queue may be rearranged to improve memory access, e.g., transactions accessing the same row may be rearranged to be subsequent to one another. At step 430, it is determined whether to issue an auto-precharge command, as described in FIGS. 1A-1K. For example, in a nonlimiting example, an auto-precharge command may be issued if the next transaction in the queue is from the same master and is associated with a different row than the transaction being processed by the controller in the queue. In some embodiments, an auto-precharge command may be issued to close the row being accessed if the transaction being processed is the last transaction in the queue, from a given master, and further in absence of receiving any hint bits to keep the row open. In some examples, an auto-precharge command is not issued to keep the row open if the transaction being processed is the last transaction in the queue, from a given master, but if hint bits are received indicate that the row should be kept open. At step 440, the process steps 410-430 is continued until all transactions from all masters are processed, upon which an auto-precharge command is issued to close the last row.

Figure 5:
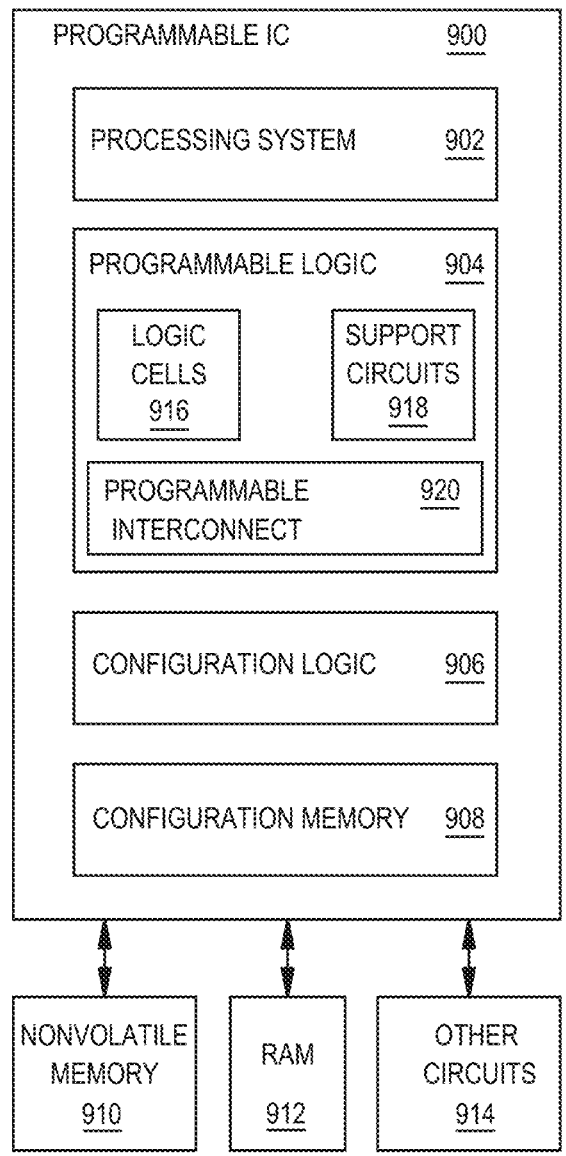
FIG. 5 is a block diagram depicting a programmable integrated circuit (IC), according to some examples.

FIG. 5 is a block diagram depicting a programmable integrated circuit (IC) 900 according to an example. The programmable IC 900 can implement the integrated circuit (IC) chip of systems of FIGS. 1A-1K, in whole or in part. The programmable IC 900 includes a processing system 902, programmable logic 904, configuration logic 906, and configuration memory 908. The programmable IC 900 can be coupled to external circuits, such as nonvolatile memory 910, RAM 912, and other circuits 914.

The processing system 902 can include microprocessor(s), memory, support circuits, IO circuits, and the like. The programmable logic 904 includes logic cells 916, support circuits 918, and programmable interconnect 920. The logic cells 916 include circuits that can be configured to implement general logic functions of a plurality of inputs. The support circuits 918 include dedicated circuits, such as transceivers, input/output blocks, digital signal processors, memories, and the like. The logic cells and the support circuits 918 can be interconnected using the programmable interconnect 920. Information for programming the logic cells 916, for setting parameters of the support circuits 918, and for programming the programmable interconnect 920 is stored in the configuration memory 908 by the configuration logic 906. The configuration logic 906 can obtain the configuration data from the nonvolatile memory 910 or any other source (e.g., the RAM 912 or from the other circuits 914).

Figure 6:
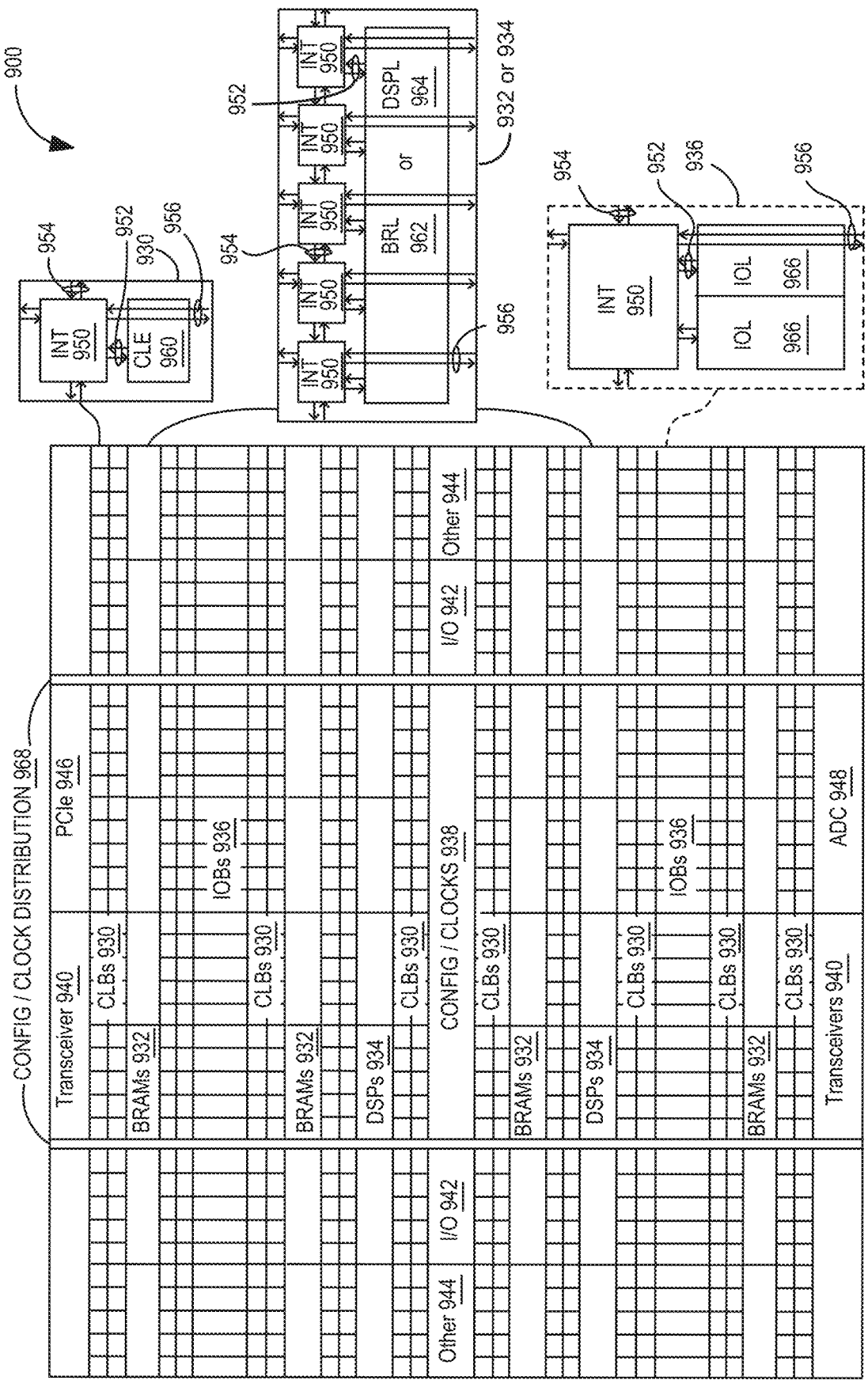
FIG. 6 is a field programmable gate array (FPGA) implementation of the programmable IC, according to some examples.

FIG. 6 illustrates an FPGA implementation of the programmable IC 900 that includes a large number of different programmable tiles including configurable logic blocks ("CLBs") 930, random access memory blocks ("BRAMs") 932, signal processing blocks ("DSPs") 934, input/output blocks ("IOBs") 936, configuration and clocking logic ("CONFIG/CLOCKS") 938, digital transceivers 940, specialized input/output blocks ("I/O") 942 (e.g., configuration ports and clock ports), and other programmable logic 944 such as digital clock managers, system monitoring logic, and so forth. The FPGA can also include PCIe interfaces 946, analog-to-digital converters (ADC) 948, and the like.

In some FPGAs, each programmable tile can include at least one programmable interconnect element ("INT") 950 having connections to input and output terminals 952 of a programmable logic element within the same tile, as shown by examples included in FIG. 9. Each programmable interconnect element 950 can also include connections to interconnect segments 954 of adjacent programmable interconnect element(s) in the same tile or other tile(s). Each programmable interconnect element 950 can also include connections to interconnect segments 956 of general routing resources between logic blocks (not shown). The general routing resources can include routing channels between logic blocks (not shown) comprising tracks of interconnect segments (e.g., interconnect segments 956) and switch blocks (not shown) for connecting interconnect segments. The interconnect segments of the general routing resources (e.g., interconnect segments 956) can span one or more logic blocks. The programmable interconnect elements 950 taken together with the general routing resources implement a programmable interconnect structure ("programmable interconnect") for the illustrated FPGA.

In an example implementation, a CLB 930 can include a configurable logic element ("CLE") 960 that can be programmed to implement user logic plus a single programmable interconnect element ("INT") 950. A BRAM 932 can include a BRAM logic element ("BRL") 962 in addition to one or more programmable interconnect elements. Typically, the number of interconnect elements included in a tile depends on the height of the tile. In the pictured example, a BRAM tile has the same height as five CLBs, but other numbers (e.g., four) can also be used. A signal processing block 934 can include a DSP logic element ("DSPL") 964 in addition to an appropriate number of programmable interconnect elements. An IOB 936 can include, for example, two instances of an input/output logic element ("IOL") 966 in addition to one instance of the programmable interconnect element 950. As will be clear to those of skill in the art, the actual I/O pads connected, for example, to the input/output logic element 966 typically are not confined to the area of the input/output logic element 966.

In the pictured example, a horizontal area near the center of the die is used for configuration, clock, and other control logic. Vertical columns 968 extending from this horizontal area or column are used to distribute the clocks and configuration signals across the breadth of the FPGA.

Some FPGAs utilizing the architecture illustrated in FIG. 9 include additional logic blocks that disrupt the regular columnar structure making up a large part of the FPGA. The additional logic blocks can be programmable blocks and/or dedicated logic.

Note that FIG. 6 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 9 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

While the foregoing is directed to specific examples, other and further examples may be devised without departing from the basic scope thereof, and the scope thereof is determined by the claims that follow.

What is claimed is:

1. A system comprising:
a plurality of masters configured to issue transactions to access a memory component, wherein each master of the plurality of masters is associated with a different thread, and wherein the memory component includes a plurality of rows;
a queue configured to receive the transactions from the plurality of masters; and
a controller configured to issue a command to access a row of the plurality of rows in response to receiving a first issued transaction of the issued transactions, wherein the first issued transaction is issued by a first master of the plurality of masters,
and wherein the controller is further configured to issue an auto-precharge command to close the row associated with the first issued transaction if the queue includes no more transactions for a bank associated with the row,
and wherein the controller is further configured to prevent issuing an auto-precharge command to keep the row associated with the first issued transaction open if a second issued transaction in the queue, subsequent to the first issued transaction, is from a master that is different from the first master and if the controller receives data associated with keeping the row associated with the first issued transaction open.

2. The system of claim 1, wherein the controller is further configured to issue the auto-precharge command to close the row associated with the first issued transaction if the second issued transaction is from a master that is different from the first master and if the controller receives no data associated with keeping the row associated with the first issued transaction open.

3. The system of claim 1, wherein the controller is further configured to issue the auto-precharge command to close the row associated with the first issued transaction if the second issued transaction is from the first master and if the second issued transaction is to access another row of the plurality of rows.

4. The system of claim 1, wherein the memory component is selected from a group consisting of Double Data Rate (DDR), High Bandwidth Memory (HBM), Dynamic Random Access Memory (DRAM), and Low Power (DDR) (LPDDR).

5. The system of claim 1, wherein the controller is selected from a group consisting of a Double Data Rate (DDR) controller and a Dynamic Random Access Memory (DRAM) controller.

6. The system of claim 1, wherein a size of the queue is smaller than a number of the transactions.

7. The system of claim 1, wherein the data associated with keeping the row associated with the first transaction open is encoded within a general bits of a bus transmitting the first transaction from the first master to the queue.

8. The system of claim 1, wherein the data associated with keeping the row associated with the first transaction open is encoded within the first transaction.

9. The system of claim 1, wherein the data associated with keeping the row associated with the first transaction open is transmitted via a separate transaction.

10. The system of claim 1, wherein each transaction of the issued transactions has an associated data indicating whether to keep the associated row open.

11. The system of claim 1, wherein the data associated with keeping the row associated with the first issued transaction open is received from a user.

12. A system comprising:
a queue configured to receive a plurality of transactions from a plurality of masters to access a memory component, wherein the memory component includes a plurality of rows; and
a controller configured to issue a command to access a row of the plurality of rows in response to receiving a first issued transaction of the plurality of issued transactions, wherein the first issued transaction is issued by a first master of the plurality of masters,
and wherein the controller is further configured to prevent issuing an auto-precharge command to keep the row associated with the first issued transaction open if a subsequent transaction in the queue from the first master accesses a same row as the first transaction,
and wherein the controller is further configured to prevent issuing the auto-precharge command to keep the row associated with the first issued transaction open, if a second issued transaction in the queue, subsequent to the first issued transaction, is from a different master than the first master, and if the controller receives data associated with keeping the row associated with the first issued transaction open.

13. The system of claim 12, wherein at least one of:
the controller is further configured to prevent issuing the auto-precharge command to keep the row associated with the first issued transaction open if the controller receives data associated with keeping the row associated with the first issued transaction open; or
the controller is further configured to issue an auto-precharge command to close the row associated with the first issued transaction, if the second issued transaction in the queue, subsequent to the first issued transaction, is from a different master than the first master, and if the controller receives no data associated with keeping the row associated with the first issued transaction open.

14. The system of claim 12, wherein the controller is configured to issue an auto-precharge command to close the row associated with the first issued transaction if a subsequent transaction in the queue from the first master accesses a different row than the first transaction.

15. The system of claim 12, wherein the controller is selected from group consisting of a Double Data Rate (DDR) controller and a Dynamic Random Access Memory (DRAM) controller.

16. The system of claim 12, wherein a size of the queue is smaller than a number of transaction of the plurality of transactions.

17. The system of claim 12, wherein the data associated with keeping the row associated with the first transaction open is encoded within a general bits of a bus transmitting the first transaction from the first master to the queue.

18. The system of claim 12, wherein the data associated with keeping the row associated with the first transaction open is encoded within the first transaction.

19. The system of claim 12, wherein the data associated with keeping the row associated with the first issued transaction open is received from a user.

20. The system of claim 12, and wherein the controller is further configured to issue an auto-precharge command to close the row associated with the first issued transaction if the queue includes no more transactions directed to a bank associated with the row.

\* \* \* \* \*